(12) United States Patent
Synder et al.

(10) Patent No.: US 6,211,739 B1
(45) Date of Patent: *Apr. 3, 2001

(54) MICROPROCESSOR CONTROLLED FREQUENCY LOCK LOOP FOR USE WITH AN EXTERNAL PERIODIC SIGNAL

(75) Inventors: Warren S. Synder, Snohomish; Fred Jaccard, Woodinville, both of WA (US)

(73) Assignee: Cypress Semiconductor Corp., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/868,079

(22) Filed: Jun. 3, 1997

(51) Int. Cl.$^7$ .................................................. H03L 7/00
(52) U.S. Cl. ......................... 331/1 A; 331/17; 375/376; 327/159; 713/400
(58) Field of Search ............................. 331/11, 17, 1 A, 331/74; 327/159; 375/376; 713/400; 714/55

(56) References Cited

U.S. PATENT DOCUMENTS

| | | | |
|---|---|---|---|
| 4,855,683 | * 8/1989 | Troudet et al. | |
| 5,381,116 | 1/1995 | Nuckolls et al. | 331/1 A |
| 5,420,543 | * 5/1995 | Lundberg et al. | 331/1 A |
| 5,446,867 | 8/1995 | Young et al. | 395/550 |
| 5,473,285 | 12/1995 | Nuckolls et al. | 331/1 A |
| 5,495,205 | * 2/1996 | Parker et al. | 331/1 A |
| 5,506,875 | 4/1996 | Nuckolls et al. | 375/375 |
| 5,511,100 | 4/1996 | Lundberg et al. | 375/376 |
| 5,565,819 | 10/1996 | Cooper | 331/111 |
| 5,670,915 | 9/1997 | Cooper et al. | 331/111 |
| 5,673,004 | * 9/1997 | Park | 331/1 A |
| 5,675,813 | 10/1997 | Holmdahl | 395/750 |
| 5,796,312 | 8/1998 | Hull et al. | 331/44 |
| 5,805,909 | * 9/1998 | Diewald | 395/750.04 |

FOREIGN PATENT DOCUMENTS 9736230   10/1997   (WO) .

OTHER PUBLICATIONS

Universal Serial Bus Specification, Jan. 15, 1996, pp. 111–143.

* cited by examiner

Primary Examiner—Arnold Kinkead
(74) Attorney, Agent, or Firm—Christopher P. Maiorana, P.C.

(57) ABSTRACT

A circuit comprising an oscillator configured to provide a first output signal in response to one or more input signals. A divider circuit may be configured to receive the first output signal of the oscillator circuit and to present a signal having a second frequency at a second output. A frequency comparator circuit may receive the second output signal and an external signal having a third frequency and may present a third output signal representing control information. A processor circuit may be coupled to the oscillator circuit, the divider circuit and the comparator circuit. The processor circuit may control the frequency of oscillation of the first output.

19 Claims, 2 Drawing Sheets

MICROPROCESSOR CONTROLLED FREQUENCY LOCK LOOP FOR USE WITH AN EXTERNAL PERIODIC SIGNAL

FIELD OF THE INVENTION

The present invention relates to oscillators generally and, more particularly, to a digitally controlled oscillator for establishing frequency and/or phase locking with an external periodic signal.

BACKGROUND OF THE INVENTION

Modern microprocessor and peripheral devices are often dependant on synchronization of various timing signals. One such standard used in peripheral devices is the Universal Serial Bus (USB), which has a variety of operating modes that allow a number of computer peripherals to be connected to a generic port. Implementation of a universal serial bus device involves a variety of design considerations including synchronizing data. Conventional USB designs may implement a phase lock loop (PLL) for synchronizing timing relationships. However, a PLL is generally complex and may require a relatively large area to implement or use components not shared with other circuits. A PLL is typically a reactive device and generally relies on feedback to synchronize incoming data. The feedback mechanism typically limits design adjustment capabilities. Without an additional voltage controlled oscillator, a PLL is limited to providing phase adjustments, rather than frequency adjustments.

A digitally controlled oscillator (DCO) is a conventional circuit for generating specific frequencies. A DCO may have a fine input F and a coarse input C (see e.g., DCO 30 in FIG. 2) which may be used to provide a variety of frequency adjustments based on external signals received at the inputs. The coarse frequency input generally controls the general range of the frequency, while the fine input F is used for more precise control. While DCOs are useful for generating an output frequency in response to the fine and coarse inputs, it is desirable to provide a system that provides a stable DCO to an output that is synchronized with respect to an external periodic signal.

SUMMARY OF THE INVENTION

The present invention concerns a circuit comprising an oscillator configured to provide a first output signal in response to one or more input signals. A divider circuit may be configured to receive the first output signal of the oscillator circuit and to present a signal having a second frequency at a second output. A frequency comparator circuit may receive (i) the second output signal and (ii) an external signal having a third frequency, and may present in response thereto a third output signal representing or containing control information. A processor circuit may be coupled to the oscillator circuit and the comparator circuit, and optionally to the divider circuit. The processor circuit may be configured to control the frequency of oscillation of the first output signal.

The objects, features and advantages of the present invention include providing a digitally controlled oscillator that may (1) establish frequency and/or phase locking relationships with an external periodic signal, (2) consume less real estate, chip area or circuit board area than a conventional PLL, and/or (3) share components with one or more other circuits (such as a microprocessor or microcontroller).

BRIEF DESCRIPTION OF THE DRAWINGS

These and other objects, features and advantages of the present invention will be apparent from the following detailed description and the appended claims and drawings, in which:

DETAILED DESCRIPTION OF THE PREFERRED EMBODIMENTS

The present invention concerns a circuit comprising a digitally controlled oscillator (DCO) that may be used to establish frequency and/or phase locking with an external periodic signal. The present invention may be implemented in conjunction with a microprocessor and/or microcontroller, where feedback may be created between the input(s) of the DCO and the resulting output signal of the DCO. The DCO may present a periodic signal in response to the input(s). The periodic signal may then be divided by a particular value and presented back to the microprocessor. The microprocessor may then provide the input(s) that may be used to generate the output signal of the DCO that may be synchronized with the external periodic signal. As a result, the DCO and microprocessor may be used to provide phase locking with respect to the external periodic signal.

Figure 1:
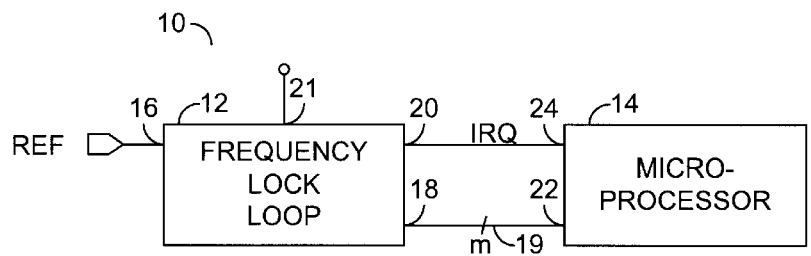
FIG. 1 is a block diagram illustrating a preferred embodiment of the present invention implemented in conjunction with a microprocessor.

Referring to FIG. 1, a block diagram of a preferred embodiment of the present invention implemented in conjunction with a microprocessor is shown. A circuit 10 generally comprises a frequency lock loop 12 and a microprocessor 14. The frequency lock loop 12 generally comprises an input 16, an input/output 18, a first output 20 and a second output 21. The input 16 generally receives an external reference signal REF. The external reference signal REF may be an external signal against which a signal presented at the output 21 may be synchronized. The external reference signal REF may be generated by a quartz oscillator, an external clock chip, or another type of circuit for generating a reference signal having periodic frequency. The input/output 18 may be connected directly or indirectly to a multi-bit bus 19. The multi-bit bus 19 generally comprises an m-bit bus which may be connected directly or indirectly to an input/output 22 of the microprocessor 14. An output 20 of the frequency lock loop 12 may be coupled to an input 24 of the microprocessor 14. The frequency lock loop 12 may present a signal (e.g., IRQ) at the output 20 that generally represents an interrupt signal generated in response to the signals received from the microprocessor 14 at the input/output 18.

Figure 2:
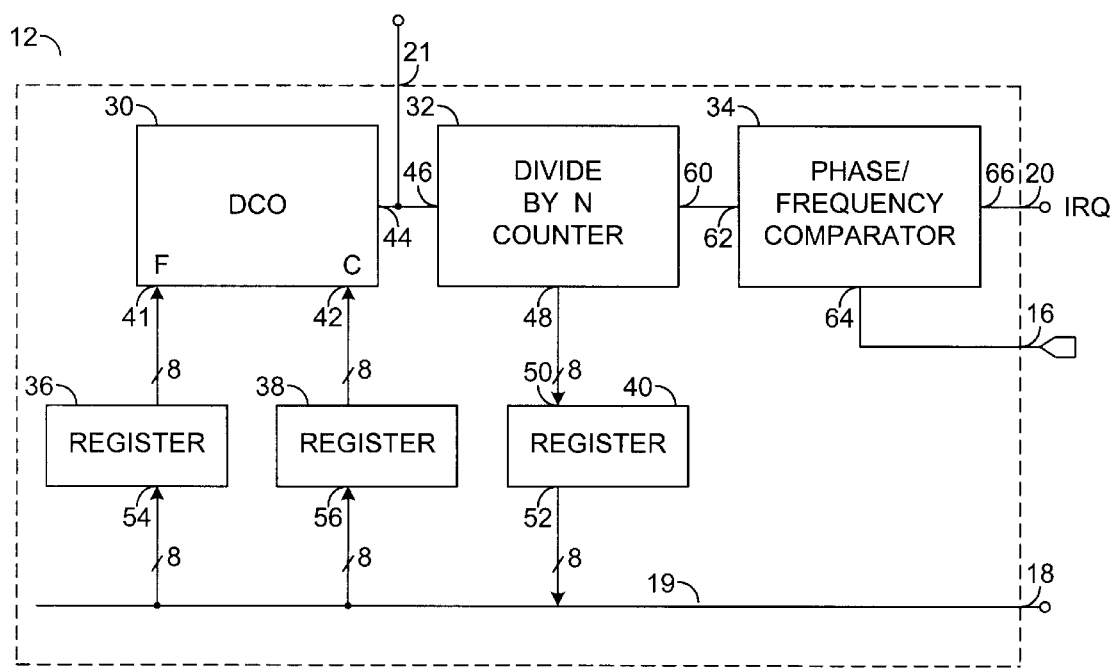
FIG. 2 is a more detailed diagram of the embodiment of the present invention exemplified in FIG. 1.

Referring to FIG. 2, a more detailed diagram of the frequency lock loop 12 is shown generally comprising a digitally controlled oscillator (DCO) 30, a divide by N counter 32, a phase and/or frequency comparator 34, a first register 36, a second register 38 and a third register 40. The DCO 30 has at least one input for receiving frequency information.

In a preferred embodiment, the DCO 30 has a first input 41 for receiving a first signal and a second input 42 for receiving a second signal. The first signal (F) generally represents a signal that may be used to provide a fine frequency adjustment that may adjust the frequency of the signal produced at output 44. The second signal (C) generally represents a coarse frequency adjustment signal that may adjust the frequency of the signal presented at the output 44 to a value within a predetermined range. The output 44 may be coupled to an input 46 of the divide by N counter 32. The divide by N counter 32 generally has an output 48 that presents a signal to an input 50 of the third register 40. The register 40 has an output 52 that generally presents a signal to the bus 19. The bus 19 may also be coupled to an input 54 of the first register 36 as well as to an input 56 of the second register 38. The bus 19 may also be coupled to the microprocessor 14 through input 1 output 18. The bus 19 may receive information from the output 52 of the third register 40 and may present information back to the inputs 54 and 56 of the first and second registers 36 and 38, respectively. The bus 19 is shown generally implemented as an 8-bit bus. However, other bus widths may be used in order to meet the design criteria of a particular application, preferably width(s) that match the number of bits of the microprocessor or microcontroller, or a width representing the width of the divide by M counter or an integer greater than or equal to the width.

The divide by N counter 32 generally has an output 60 that may be coupled to an input 62 of the phase and/or frequency comparator 34. The phase and/or frequency comparator 34 also has an input 64 that may receive an external reference signal e.g. (REF). The reference signal REF may be a reference signal generated by a host computer in, for example, a universal serial bus.

The frequency of the reference clock may vary. One example of the reference clock may be a standard USB reference clock which is generally a 1 kHz clock. The phase and/or frequency comparator 34 presents an interrupt signal (e.g., IRQ) at an output 66. A comparison between the signals received at the inputs 62 and 64 may be used to generate the interrupt signal IRQ which may activate an interrupt service routine. The interrupt service routine may adjust the output of the DCO 44 by presenting the fine and coarse adjustments to the inputs 41 and 42 of the DCO 30. Generally, for a higher tolerance, a greater amount of processing resources will be used. For example, if the frequency at the input 62 is greater than the frequency at the input 64 by a predetermined threshold, the interrupt signal IRQ may be asserted. The particular value of the predetermined threshold may be adjusted in order to provide an appropriate tolerance of the frequency presented at the output 44. If the frequency at the input 62 is less than or greater than the frequency at the input 64 by the predetermined threshold, the interrupt signal IRQ may also be asserted. The output 66 may represent a phase difference between the input 62 and the input 64.

The signals presented from the registers 36 and 38 to the inputs 41 and 42 may be received from the microprocessor 14 through the bus 19. The microprocessor 14 may analyze the signal received from the output 52 of the register 40 to determine the frequency of oscillation of the signal presented at the output 44 of the DCO 30. In response, the microprocessor 14 may present signals to the inputs 54 and 56 of the registers 36 and 38, which in turn, may generate fine and coarse adjustment signals presented to the inputs 41 and 42. The presentation of the fine and coarse signals to the inputs 54 and 56 in response to the signals received at the output 52 may be characterized as a loop filter function. The microprocessor 14 may also be used to execute instructions that may operate other circuit components (not shown) to minimize the overall circuit area. If the microprocessor 14 has enough idle cycles, and the external reference signal REF has a low enough frequency, the microprocessor 14 may implement the loop filter function in software. The particular idle cycles necessary to implement the loop filtering function in software in the microprocessor will vary with the particular application. For example, if the microprocessor 14 is capable of processing two million instructions per second (MIPS), the loop filtering function requires about 500 instructions per cycle, and the reference clock is a 1 kHz signal (such as in a USB device), approximately 25% of the cycles in the microprocessor 14 may be needed to process the filtering function. The software generally comprises a set of locking instructions to provide the initial locking of the signal presented at the output 21 and a set of tracking instructions to maintain the lock of the signal presented at the output 21.

The function performed by the present circuit of FIGS. 1 and 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus also includes a computer product which may be a storage medium including instructions which can be used to program a computer to perform a process in accordance with the present invention. The storage medium can include, but is not limited to, any type of disk including floppy disk, optical disk, CD-ROMs, and magneto-optical disks, ROMs, RAMs, EPROMs, EEPROMs, Flash memory, magnetic or optical cards, or any type of media suitable for storing electronic instructions.

The locking software generally responds to the previous history of the frequency presented at the output 21. The software may be implemented as a simple logic table to respond exclusively to the previous frequency presented at the output 21, or the software may be implemented as a more advanced logic capable of distinguishing trends at the output 21. For example, a look-up table may be implemented which may provide such additional adjustments. In any event, the logic allows post-production configuration of each die independently of particular process variations. The registers 36, 38 and 40 are shown generally implemented as 8-bit devices in order to provide 256 different states.

Figure 3:
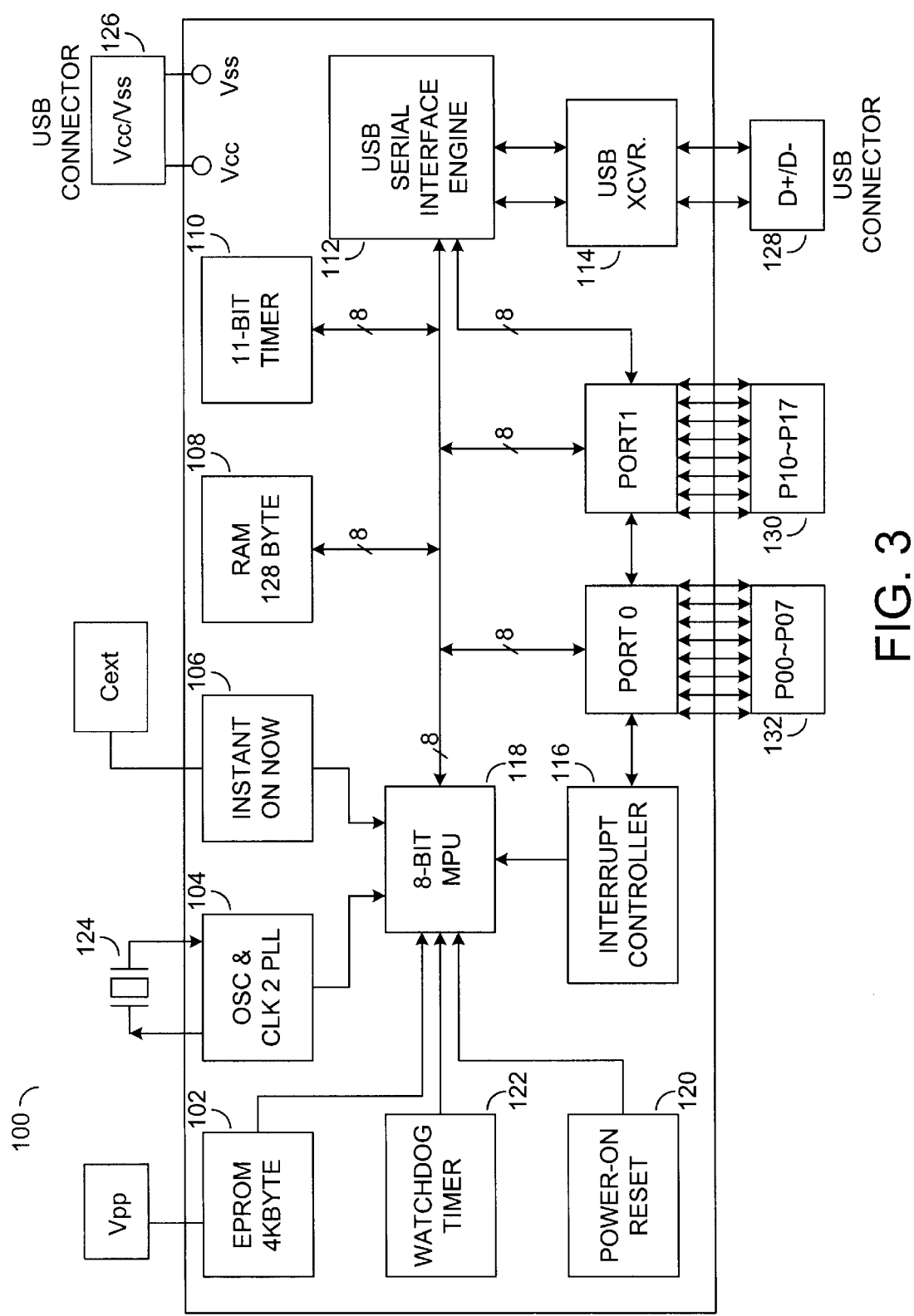
FIG. 3 is a diagram illustrating an example of the present invention implemented in a circuit.

Referring to FIG. 3, an architecture of a universal serial bus device 100 is shown. The USB device 100 generally comprises an EPROM 102, and oscillator and PLL block 104, an instant on block 106, a ram 108, a timer block 110, an interface engine 112, a USB Xcrv block 114, a first port 1, a second port 0, an interrupt controller, an MPU, a power-on reset block 120, and a watchdog timer block 122. The MPU 118 may be an 8-bit microprocessor that generally corresponds to the microprocessor shown in FIG. 1. The oscillator and PLL block 104 generally corresponds to the external reference frequency in FIG. 1 that may receive a signal from an external oscillator 124. A number of USB connectors 126, 128, 130 and 132 may be connected to an external device. The USB device 100 generally incorporates a ROM, a SRAM and logic elements on a single chip. The MPU 118 may be used both in the present invention as well as to control additional USB functions. While the RAM block is shown generally implemented as an 128-bit RAM, other sized RAMs may be implemented.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a digitally controlled oscillator circuit configured to provide a first output signal having a first frequency of oscillation in response to one or more input signals;
    a comparator circuit configured (i) to receive said first output signal, (ii) to receive an external signal having a second frequency of oscillation and (iii) to present a second output signal having a first logic state when a difference in frequency between said first output and said external signal is greater than a predetermined value and a second logic state when said difference is less than said predetermined value; and
    a processor circuit configured to receive said second output signal from said comparator circuit, said processor configured to (i) control the first frequency of oscillation by adjusting said one or more input signals, (ii) adjust the first frequency of oscillation of said first output signal by performing an interrupt routine executed by said processor when said second output signal is at said second logic state and (iii) not adjust the first frequency of oscillation of said first output signal when said second output signal is at said first logic state.

2. The circuit according to claim 1 further comprising:
    a divider circuit configured to receive said first output signal and to present a third output signal having a third frequency.

3. The circuit according to claim 1 further comprising a divider circuit producing a third output signal having a third frequency.

4. The circuit according to claim 3, wherein said divider circuit comprises a frequency divider circuit.

5. The circuit according to claim 1 wherein said comparator circuit comprises a frequency comparator circuit.

6. The circuit according to claim 5 wherein the circuit further comprises: (i) a first input configured to provide a coarse frequency adjustment signal and (ii) a second input configured to provide a fine frequency adjustment signal.

7. The circuit according to claim 3 wherein said third frequency is lower than said first frequency.

8. A circuit comprising:
    a digitally controlled oscillator for generating a first output signal having a first frequency of oscillation in response to one or more input signals;
    means for generating a second output signal having a first logic state when a difference in frequency between said first output and an external signal having a second frequency is greater than a predetermined value and a second logic state when said difference is less than said predetermined value;
    means for receiving said second output signal; and
    means for (i) controlling the first frequency of oscillation by adjusting said one or more input signals, (ii) changing said one or more input signals by performinq an interrupt routine executed by said generating means when said second output signal is at said second logic state and (ii) not adjust the frequency of oscillation of said first output signal when said second output is at said first logic state.

9. The circuit according to claim 8 wherein said digitally controlled oscillator includes an output having said frequency of oscillation in response to said one or more input signals comprising: (i) a first input configured to receive a coarse frequency adjustment signal and (ii) a second input configure to receive a fine frequency adjustment signal.

10. A method for synchronizing an output signal with an external signal, comprising:
    digitally generating said output signal in response to one or more input signals;
    comparing said output signal with said external signal to generate an interrupt signal when a difference between said one or more input signals and said external reference signal is greater than a predetermined value;
    receiving said interrupt signal; and
    adjusting said one or more input signals by performing an interrupt routine executed by said processor when said interrupt signal is at a first logic state and not adjusting said one or more input signals when said interrupt signal is not at said first logic state.

11. The method according to claim 10 wherein said external signal comprises an external reference signal.

12. The method according to claim 10 wherein said output signal is periodic and has a frequency of oscillation.

13. The method according to claim 10 wherein said output signal is generated by a DCO and said one or more input signals comprises a coarse input into said DCO.

14. The circuit according to claim 6, wherein said coarse and said fine frequency adjustment signals provide said adjustment in said frequency of oscillation of said first output signal.

15. The circuit according to claim 9, wherein said coarse and said fine frequency adjustment signals provide said adjustment in said frequency of oscillation of said first output signal.

16. The circuit according to claim 8, further comprising:
    means for generating a third output signal having a third frequency of oscillation in response to one or more input signals.

17. The circuit according to claim 16 further comprising means for dividing said first frequency.

18. The circuit according to claim 16 wherein said means for generating said second output comprises a comparator circuit.

19. The circuit according to claim 17 wherein said means for dividing produces said third signal having said third frequency lower than said first frequency.

* * * * *